(12) United States Patent
Ross

(10) Patent No.: US 6,515,665 B1
(45) Date of Patent: Feb. 4, 2003

(54) DATA FILTERING/SUPPRESSION OF DATA ACQUISITIONS/SAMPLES FOR MULTI-CHANNEL ELECTRONIC DISPLAY AND ANALYSIS

(75) Inventor: Forest L. Ross, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/337,173

(22) Filed: Jun. 21, 1999

(51) Int. Cl.[7] .................. G06T 11/20; G09G 5/22
(52) U.S. Cl. .................... 345/440; 345/440.1
(58) Field of Search ................ 345/440, 501; 702/39, 128, 189, 79

(56) References Cited

U.S. PATENT DOCUMENTS

| 5,397,981 A | * | 3/1995 | Wiggers | 324/729 |
| 5,790,133 A | | 8/1998 | Holcomb | |
| 5,815,166 A | * | 9/1998 | Baldwin | 345/506 |
| 5,854,996 A | * | 12/1998 | Overhage et al. | 702/189 |
| 5,929,838 A | * | 7/1999 | Hall | 702/67 |
| 6,327,544 B1 | * | 12/2001 | Samuels | 702/70 |

FOREIGN PATENT DOCUMENTS

| GB | 2355308 A | * | 6/1999 | G01R/13/20 |

* cited by examiner

Primary Examiner—Jeffery Brier
Assistant Examiner—A Blackman
(74) Attorney, Agent, or Firm—Boulden G. Griffith; Thomas F. Lenihan

(57) ABSTRACT

Arbitrary sets of samples may be suppressed from display and analysis. The resulting record may then be saved in its abbreviated form or discarded. Such a record may also be retrieved and arbitrarily partially suppressed a second or third time, making a series of smaller and less complete acquisition histories. Each of these records may be saved with or without suppressed samples and may be later redisplayed reliably showing those samples originally saved.

5 Claims, 3 Drawing Sheets

FIG.4

DATA FILTERING/SUPPRESSION OF DATA ACQUISITIONS/SAMPLES FOR MULTI-CHANNEL ELECTRONIC DISPLAY AND ANALYSIS

FIELD OF THE INVENTION

This invention relates to the viewing of data in multi-channel electronic acquisition instrument displays, and more particularly to a method of selectively processing a subset of acquired data for inclusion in a multi-channel electronic acquisition instrument display.

CROSS-REFERENCE TO RELATED APPLICATIONS

[Not applicable]

STATEMENT REGARDING FEDERALLY SPONSORED RESEARCH AND DEVELOPMENT

[Not applicable]

BACKGROUND OF THE INVENTION

Historically, users have been able to display a subset of the channels for which data was acquired, masking out the data associated with channels that are not presently of interest to the user. This form of data suppression selects which channels of data are of interest. Individual channels and groups of channels can be selected for display or hidden from view, according to user preference. These decisions can be made before or after data is acquired. Whenever these decisions are made, they serve to mask channels of data from view.

In the past the most common way to suppress samples is to reduce the number of samples stored in the instrument at the time data was acquired. This had the problem that if the operator needed more samples to evaluate he had to increase memory depth and re-acquire data. This is time consuming and expensive if the problem being analyzed is hard to reproduce.

Historically, other forms of filtering have also been available along the sample or time axis. The data filtering along this axis has been, in one manner or another, filtering in accordance with some sort of dependence on the data acquired. Individual bits are examined to determine if the sample is to be displayed or suppressed. This is known as "data qualification", and it can be applied during the acquisition process or after the data is acquired. The latter is known as "post-processing".

A more complex form of post-processing is "disassembly. Assembly is the conversion of microprocessor code, that language used by the programmer, into the specific patterns of 1's and 0's that are understood by a particular type of microprocessor. Disassembly is the reverse process, converting 1's and 0's used by the microprocessor back into assembly language that can be understood by the programmer. This process requires examining large amounts of acquired data and converting it to processor mnemonics.

A variety of data simplifications can be applied during the display of Disassembled data in the instrument. Hardware cycles can be suppressed, leaving only the software execution operations available in a clear and concentrated form. Program control flow strips out all samples except for those that caused a branch, subroutine call subroutine return or interrupt call or return during processor execution. Alternatively, only program subroutine entrance and exit cycles can be shown, creating an outline-like view of the software subroutines that have been executed.

"State-based" filtering is another form of general purpose filtering. The operator-supplied filter examines acquired data one sample at a time and controls, which samples are to be presented for display. (State machines generally examine the state of old data and new data and go to a corresponding next state.) State based filters are powerful tools, but they also require a lot of processing time to read and evaluate data before it can be displayed. This type of filter is known as "state-based" because each acquired sample is dealt with according to the prior data state as well as the current state data, much like a trigger state machine (or the generic state machine described above).

Over the years, as the price of memory has gone way down and the length of the data records captured by multi-channel electronic acquisition instruments has gone way up, relatively huge memory depths have become increasingly common. As acquisition memories become longer, more time consuming to acquire, and unwieldy to analyze, new methods for focusing operator attention into the most relevant portions of the data are increasingly valuable.

Ideally, a tool for accomplishing this filtering would not add overhead to the display process, as manipulating very large data records already requires a lot of time. It is expected that this filtering tool is used in conjunction with other types of filters. In other words, this data filter supplements other types of filters, rather than replacing them.

BRIEF SUMMARY OF THE INVENTION

In accordance with the present invention, arbitrary sets of samples may be suppressed from display and analysis. The resulting record may then be saved in its full form, i.e., unsuppressed and suppressed, or abbreviated, unsuppressed only, form. Such a record may also be retrieved and arbitrarily partially suppressed a second or third time, making a series of smaller and less complete acquisition histories. Each of these records may be saved with or without suppressed samples and may be later redisplayed, reliably showing those samples originally saved and their attributes, such as the time the sample was stored and its original sample number). Records saved without suppressed samples are permanently lost.

BRIEF DESCRIPTION OF THE SEVERAL VIEWS

FIG. 4 is a listing (state table) perspective on a portion of a virtual view.

DETAILED DESCRIPTION OF THE INVENTION

Sample suppression according to the present invention gives the operator arbitrary control over which instrument samples are available for display and analysis. This control may be thought of as "arbitrary" because the operator can pick any instrument sample and decide to display (show) or suppress (hide) that sample. This choice is independent of whether the sample is associated with hardware or software activity, or whether it occurs (or doesn't) in connection with any other criteria.

This type of sample suppression permits the operator to be the "judge", determining which samples will be part of the display and which will be suppressed. This is useful because not all samples collected in a particular acquisition are important and worth analysis. Moreover, the perceived value and importance of retained samples can change with different levels of scrutiny. Thus, the as the operator learns more about his acquired and saved data, further suppression decisions may be desired as part of the continuing analysis process.

Figure 1:
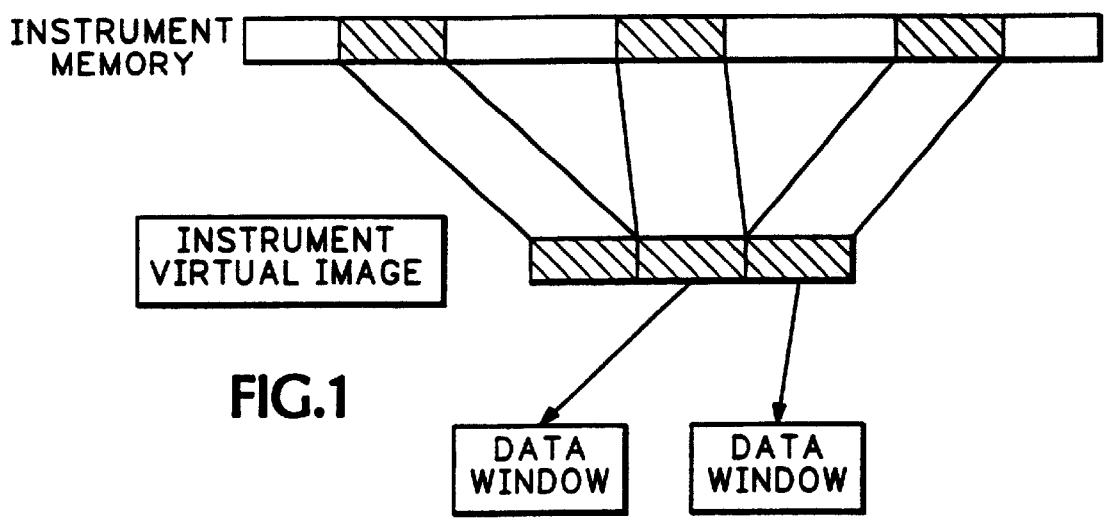
FIG. 1 is a conceptual illustration of how a virtual view is constructed from portions of the complete acquired memory record.

FIG. 1 is a conceptual illustration of how a virtual view is constructed from portions of the acquired memory. Samples of data (voltage level, state value, time of measurement, etc.) that pass through a sample suppression process can best be described as a "virtual view" or "virtual image". All data windows display their data from this virtual view. The user has controls that allow samples (individual or blocks of samples) to be added or removed from this image without acquiring new data. This provides the operator with complete control over which samples to display, analyze and eventually save to disk.

The number and size of these blocks of samples is limited only by the number of samples originally acquired. Each sample of Instrument Memory can only appear once in the virtual image. The order of samples in the virtual image must be monotonic order (i.e. actual sample 5 cannot appear before actual sample 4 in the virtual image).

Data windows receive samples from the instrument's virtual image. As in this example each view can display the same or different portions of the virtual view. If the operator adds instrument samples to the virtual view these will be displayed by all instrument views.

Figure 2:
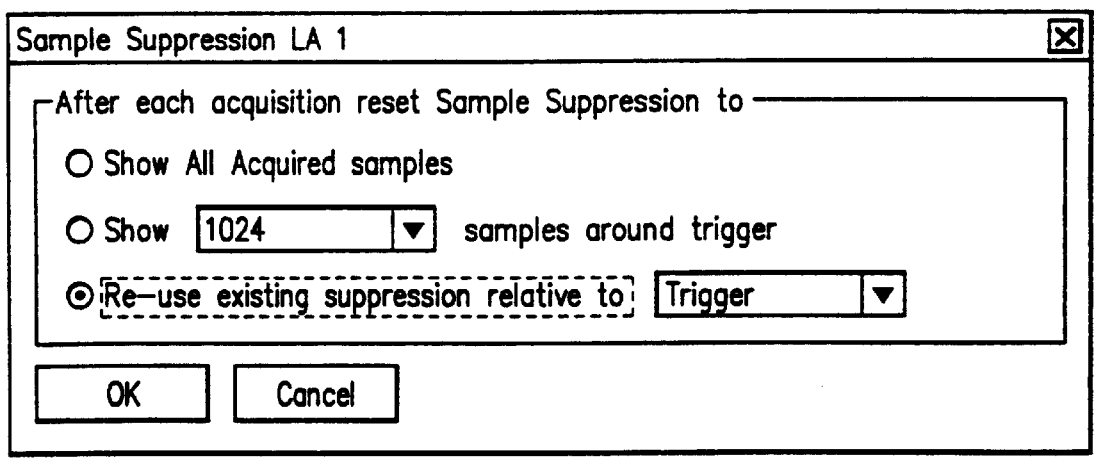
FIG. 2 is an illustration of the virtual view management dialog box.

Referring next to FIG. 2, there is shown an illustration of the virtual view management dialog box. This dialog box allows the operator to control how much data is initially delivered to the data view. The instrument acquires and fills all memory, but only the samples so defined in this dialog box are displayed or analyzed. After data acquisition the operator can, at his discretion, show or suppress more samples using direct manipulation through the listing or waveform views.

Figure 3:
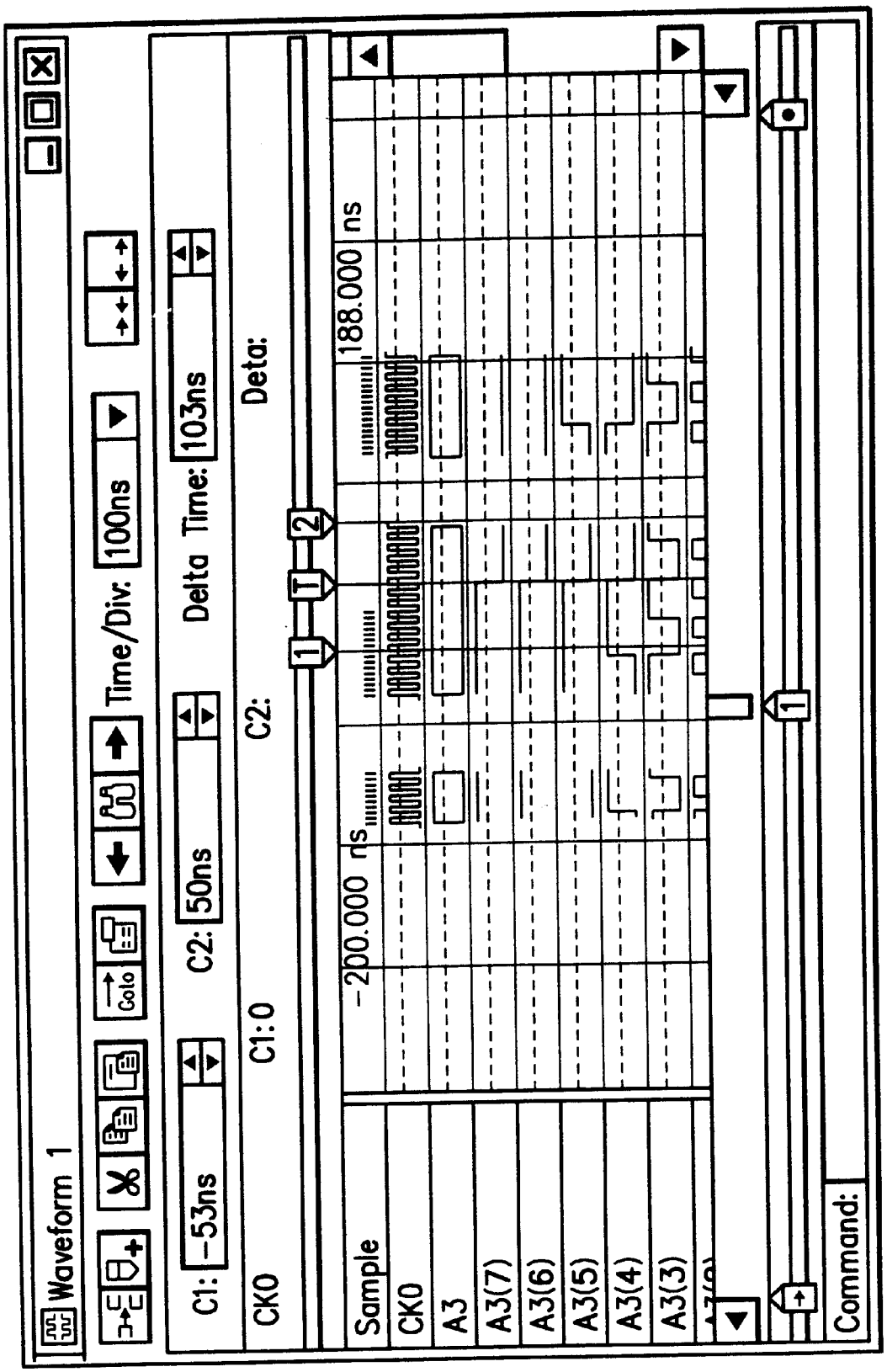
FIG. 3 is a waveform (time axis) overview of a portion of the virtual view.

FIG. 3 is a waveform (time axis) overview of a portion of the virtual view. Where data has been suppressed, dashed lines mark the location of the data that is missing. All remaining samples are displayed in typical timing diagram format. Suppression of samples does not compress the display horizontally, as doing so would change the time relationship of data on the screen, violating the operator's expectations. By removing data that is not relevant, the user can focus on those samples that are most relevant.

Figure 4:
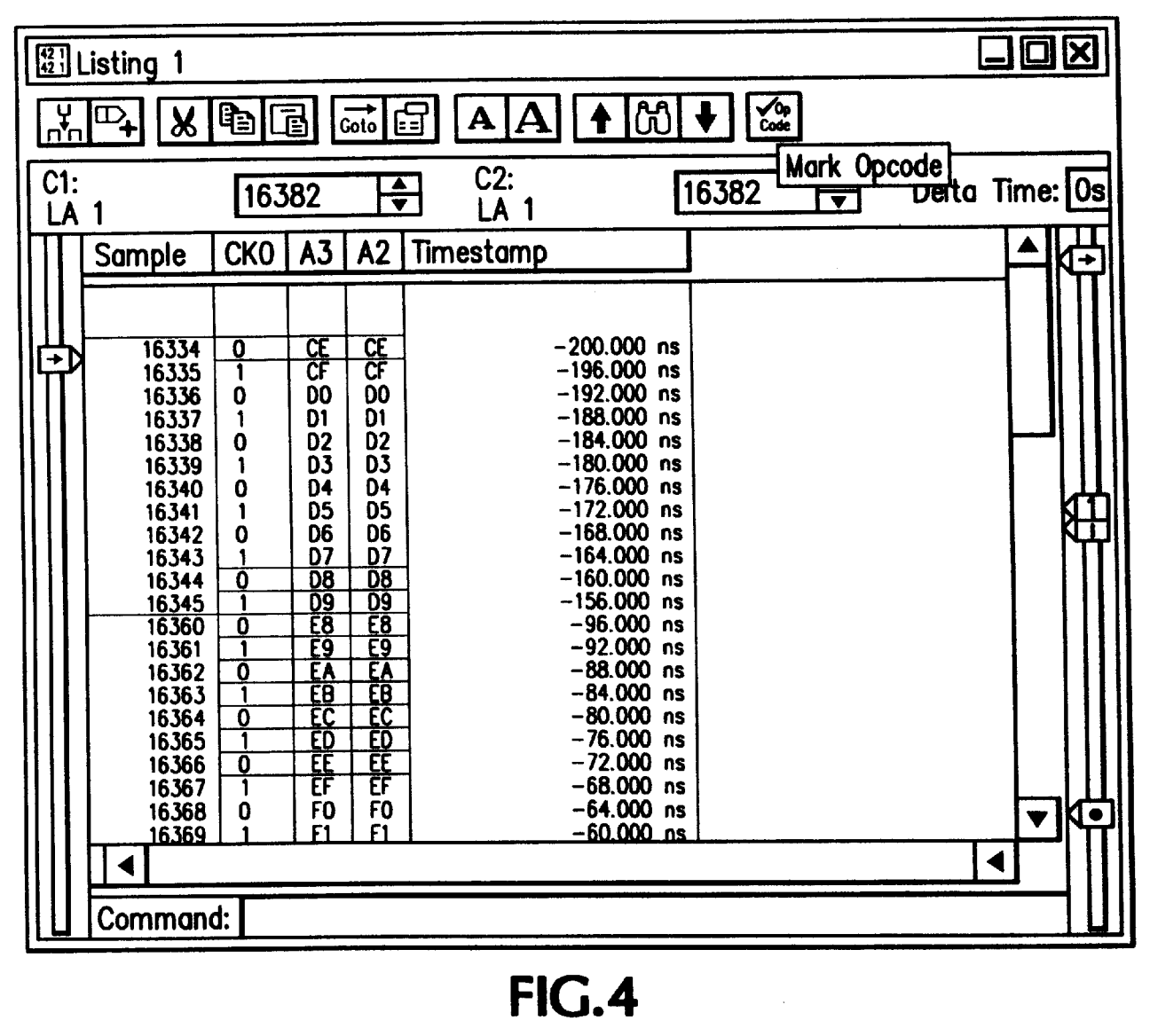

Referring now to FIG. 4, this is an illustration of is a listing (state table) perspective on a portion of a virtual view. The gray horizontal lines in the sample column show where gaps are located due to sample suppression. Through the use of suppression the user can directly control how much data is visible and thereby concentrate on only the data that is relevant to his measurement needs. Notice that this display removes the suppressed samples completely and thereby allows the display to be compressed. This consolidation helps the operator focus in on the important part of the data. The operator can show or suppress samples through a waveform or listing window using direct manipulation of controls, such as a mouse or keyboard. The user selects a sample or block of samples, and then indicates whether they are to be shown or suppressed. Returning then to FIG. 4 and the sample above, the operator can see those acquired samples that are visible (e.g., samples 16334 through 16345 and 16360 through 16369) and those which are suppressed (Samples 0 through 16333, 16346 through 16359). In this way the listing window gives very detailed information on how sample suppression currently effects the display of data.

Sample suppression can be added to other forms of data filters (state based, disassemblers, data qualification, etc.). This gives the operator control over how much of the data in the instrument memory is to be analyzed by other software filters. This allows the operator to scroll back and forth through the data during the analysis process much faster because these other software analysis tools no longer have to spend time analyzing those areas of memory that have been suppressed. Any suppressed samples can later be recovered and added back into the analysis process if desired. The ability to unsuppress samples is very important capability. However, saving without suppressed samples causes them to be permanently deleted. The user can no longer un-suppress those samples.

The beauty of this approach is that the process of suppressing data does not have to be a careful, or even thoughtful, process, based on knowledge of the content of the data. Instead, data can be arbitrarily manipulated after an acquisition and before the operator has meaningful understanding of which data is which. Almost all filters in the past have been designed to evaluate a very specific kind of data. They operate by examining data stored by the instrument, according to acquisition and display algorithms. These tools tend to be application specific and therefore do not work in all circumstances. Even a general purpose state-based filter works by examining data samples and their context.

The instrument can keep track of the virtual view using a bitmap or some other means, such as a list of samples or sample ranges. A bit map index is the functional equivalent of adding a single bit data extension to the existing memory contents. These bits can have either sense, signifying either data to be suppressed or data to be displayed and analyzed. This bit map approach is most efficient when the number of fragmentary (range of samples) is expected to be large. A list can contain a pair of sample numbers identifying a range of samples to show or suppress. Such a list-based approach is more efficient when the number of fragments (ranges of samples) is expected to be small.

Alternatively, a separate address list can identify samples to be suppressed and samples to be displayed, each address acting as either an entry point or exit point with respect to the active or suppressed samples. Alternatively, the virtual view can be maintained via a dual interleaved list of sample numbers or identifying addresses. One set signifies starting points of suppressed or displayed data, while the other set signifies starting points for the complementary type of location (displayed or suppressed). It should be noted that a sample, the item pointed to by a sample number or sample address, may contain any instrument measurement result, such as state value, voltage value, or time value, and any other auxiliary information associated with that sample.

One optional feature of sample suppression is the ability to save only those samples in the virtual view. When the operator opens and displays this file the product should know that the missing samples are no longer available for display. It should also allow all remaining samples to be suppressed or shown without restriction. This requires that the list keep track of which suppressed samples are currently saved and which are not. This can be done by providing a property in the list indicating whether the sample is currently stored and available for display.

In a preferred embodiment of this filter, there are some properties of the acquired data that it would be best not to change. For instance, usually, samples should not be renumbered. Each sample has a unique number that identifies its original storage location in acquisition memory, and it is best not to change that. Also, the display order will generally not be changed. Changing the sample suppression list should generally never cause the display order of two samples to be different. There may be cases where processing by another algorithm (disassembler or state based filter) overrides this general rule. Changes in sample suppression or inclusion status should not cause the same sample to appear twice on the display.

Usually there is one single suppression list per instrument. In that type of implementation, all data windows display data that pass through this common suppression filter. Another possibility is to provide a separate suppression filter for each data window. The operator then has a choice of several different displays that show different portions of the acquired data.

While a preferred embodiment of the present invention has been shown and described, it will be apparent to those skilled in the art that many changes and modifications may be made without departing from the invention in its broader aspects. The claims that follow are therefore intended to cover all such modifications as are permitted by the patent laws of any countries in which this patent is granted.

What is claimed is:

1. A multi-channel electronic acquisition instrument comprising:

digital data acquisition means, for acquiring a plurality of sequential digital data samples from each of a plurality of data channels, the sequential digital data samples being indicative of behavior of one of the plurality of data channels over an interval of time;

data acquisition memory, for storing an acquired data record, the acquired data record including the plurality of acquired sequential digital data samples from each of the plurality of data channels, and the acquired data record including the plurality of sequential digital data samples associated with each of the plurality of channels;

data suppression means for allowing a user to define a virtual view of the stored acquired data record, said virtual view containing a reduced plurality of sequential digital data samples associated with each of the plurality of channels; and display means for displaying contents of the virtual view of the stored acquired data record;

wherein the virtual view of memory is defined by user identification of noncontiguous regions along a sample-axis for which data will be suppressed; and wherein the user identification of samples to be suppressed includes defining each block of a plurality of blocks of data in terms of width and by reference to its respective location relative to a particular sample or time axis location.

2. A multi-channel electronic acquisition instrument according to claim 1 wherein the virtual view of memory is maintained as a virtual view sample list for the data acquisition memory, the sample list storing the first sample and last sample of suppressed or displayed regions of the virtual view.

3. A multi-channel electronic acquisition instrument according to claim 1 wherein the virtual view of memory definition may be saved for future use.

4. A multi-channel electronic acquisition instrument according to claim 3 wherein the virtual view of memory is saved with enough information to completely reconstruct all remaining samples with their original time alignment and sample numbers.

5. A multi-channel electronic acquisition instrument according to claim 4 wherein the virtual view of memory is saved with a list of locations to be suppressed.

* * * * *